United States Patent
Lee et al.

(10) Patent No.: US 7,518,409 B2
(45) Date of Patent: Apr. 14, 2009

(54) INPUT STAGE OF SEMICONDUCTOR DEVICE WITH MULTIPLE PADS OF COMMON FUNCTION, AND MULTI-CHIP PACKAGE HAVING THE SAME

(75) Inventors: You-Mi Lee, Seoul (KR); Woo-Seop Jeong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 426 days.

(21) Appl. No.: 11/352,175

(22) Filed: Feb. 10, 2006

(65) Prior Publication Data
US 2006/0180913 A1      Aug. 17, 2006

(30) Foreign Application Priority Data
Feb. 11, 2005    (KR) ...................... 10-2005-0011540

(51) Int. Cl.
*H01L 25/00* (2006.01)
(52) U.S. Cl. .......................... 326/101; 326/82; 257/686
(58) Field of Classification Search ................... 326/62, 326/83, 86, 87; 327/108, 109, 333; 257/686
See application file for complete search history.

(56) References Cited

U.S. PATENT DOCUMENTS 5,701,031 A * 12/1997 Oguchi et al. ............... 257/686
2002/0140091 A1* 10/2002 Callahan ..................... 257/734
2003/0034818 A1*  2/2003 Shenai et al. ............... 327/218
2003/0211679 A1* 11/2003 Kim et al. ................... 438/200

FOREIGN PATENT DOCUMENTS

| JP | 2001-345344 | 12/2001 |
| JP | 2003-007963 | 1/2003 |
| KR | 10-2000-0019885 | 4/2000 |
| KR | 10-2004-0031995 | 4/2004 |

* cited by examiner

*Primary Examiner*—Rexford Barnie
*Assistant Examiner*—Jany Tran
(74) *Attorney, Agent, or Firm*—Mills & Onello, LLP

(57) ABSTRACT

An input stage of a semiconductor device includes at least two pads, input buffers, a current source, and a logic operation circuit. The at least two pads, to which the input buffers respectively correspond, perform a common function. The current source provides a current to the respective at least two pads so that a predetermined fixed logic value is outputted by the input buffers while the respective at least two pads have a floating status. The logic operation circuit performs a logic operation on signals applied to the respective at least two pads via the input buffers, and outputs a resultant value to an internal circuit. When the input end of the semiconductor is used in a multi-chip package, the internal circuit may not be affected by the other pads that are not bonded to external pins, even though only one pad is bonded to an external pin.

27 Claims, 8 Drawing Sheets

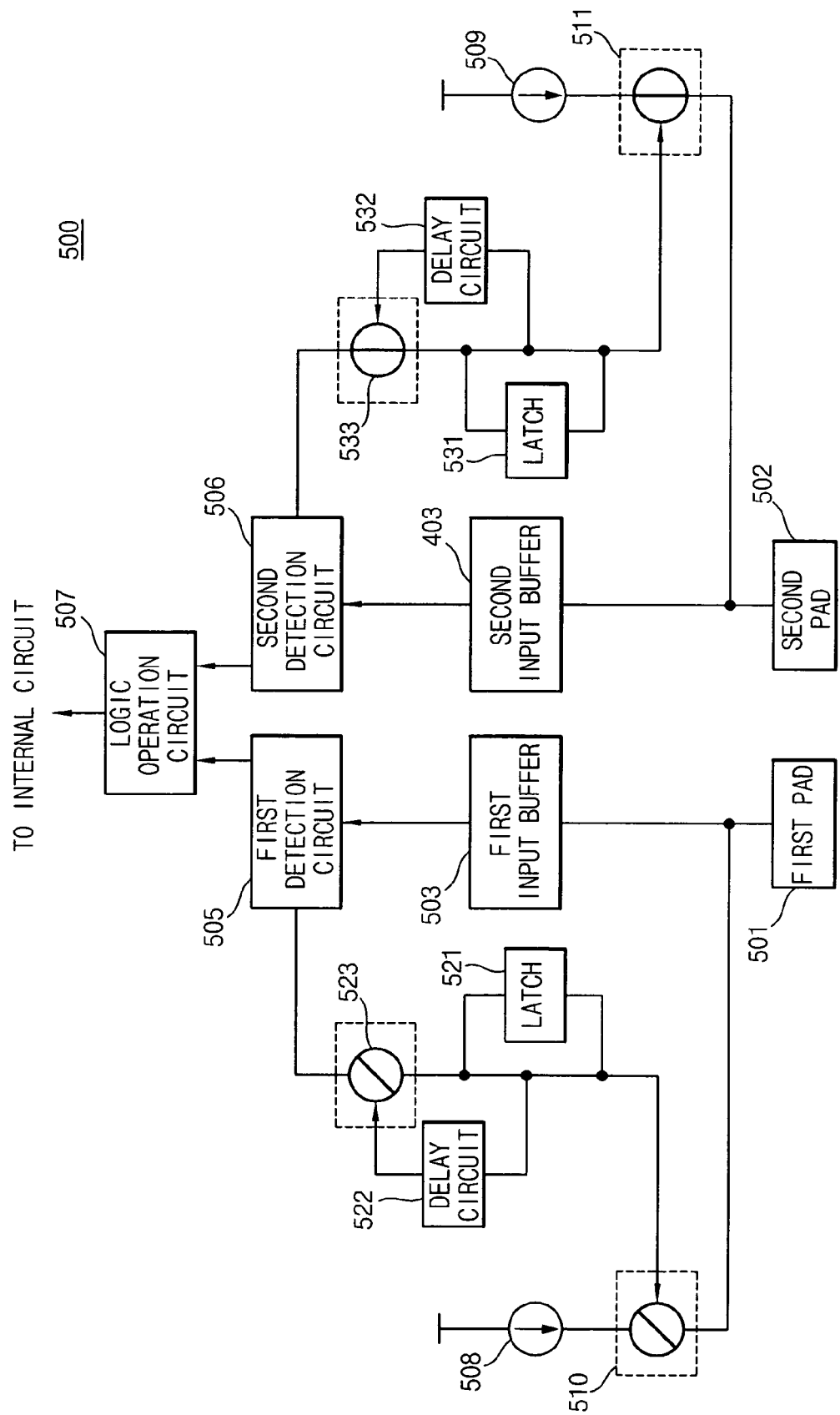

INPUT STAGE OF SEMICONDUCTOR DEVICE WITH MULTIPLE PADS OF COMMON FUNCTION, AND MULTI-CHIP PACKAGE HAVING THE SAME

CLAIM FOR PRIORITY

This application claims priority to Korean Patent Application No. 2005-11540 filed on Feb. 11, 2005 in the Korean Intellectual Property Office (KIPO), the entire contents of which are herein incorporated by reference in its entirety.

BACKGROUND OF THE INVENTION

1. Field of the Invention

Example embodiments of the present invention relate in general to a semiconductor memory device, and more particularly to a signal input stage of a semiconductor memory device, and a multi-chip package that utilizes the semiconductor memory device having the signal input stage.

2. Description of the Related Art

With the development of semiconductor technologies, functions and capacity of a single chip have increased as more elements have been integrated into the same chip area. Also, in an aspect of a packaging technology of a semiconductor chip, technologies corresponding to leaner and lighter products have been developed while the functions and the capacity of the single chip have been developed. Such technologies, including a multi-chip package (MCP) technology and a multi-stack package (MSP) technology, which can mount a plurality of semiconductor chips in a single semiconductor package, have been widely used.

The multi-chip package technology is a technology that constitutes one package by enabling a plurality of semiconductor chips to be mounted onto one lead frame. The multi-chip package technology is frequently applied to an application field such as a portable device necessarily requiring the leaner and lighter product. For instance, the multi-chip package technology is widely used for various purposes that realize a high capacity of memory by stacking multiple memory chips, and integrate various kinds of memory chips and controllers into one package.

One type of multi-chip package is a dual die package (DDP) in which two chips are mounted in one package. Although there exists a method for arraying two chips in parallel in one dual die package, a method for minimizing the size of the package area by stacking two chips is more widely used.

FIG. 1 is a cross-sectional view illustrating a conventional dual die package having a stacked structure.

Referring to FIG. 1, in the dual die package 100, a first semiconductor chip 110 and a second semiconductor chip 120 are attached onto upper and lower surfaces of a die pad 130, respectively. A pad 111 of the first semiconductor chip 110 and a pad 121 of the second semiconductor chip 120 are electrically connected to upper and lower surfaces of an inner end of a lead 140, respectively, via a wire-bonding using conductive metal wires 141 and 142. The inner end of the lead 140 is spaced apart from the die pad 130 by a predetermined interval.

Further, elements including the first and second semiconductor chips 110 and 120 are protected from the external environment by a package body 150 formed with plastic materials such as epoxy molding resin.

In this case, bottom surfaces, on which a pad is not formed, of the first and second semiconductor chips 110 and 120 are attached onto the upper and the lower surfaces of the die pad 130. A non-conductive bonding agent made of epoxy or a bonding tape made of polyimide (PI) materials have been used as bonding agents 151 and 152.

There may be two types of dual die packages. In a first type of dual die package, one chip is stacked over another chip. In a second type of dual die package, two chips are arranged in parallel.

As illustrated in FIG. 1, irrespective of the two types of dual die packages, it is necessary to divide the two chips existing in the package.

For instance, in a case of the first type of dual die package, it is necessary to identify a top chip (TOP) located in a top portion and a bottom chip (BOTTOM) located in a bottom portion. Conventionally, in addition to a chip select signal or a clock enable pad existing in respective chips, there exist other pads for determining whether a corresponding chip is located in the top or the bottom portion, thereby allowing the top chip (TOP) and the bottom chip (BOTTOM) to be identified according to a bonding state of the pads.

Further, recently, a chip select pin or a clock enable pin in a dual die package has been prepared for the top chip (TOP) and the bottom chip (BOTTOM). The chip select pin or the clock enable pin is connected respectively to a chip select pad or a clock enable pad of each of the chips. For instance, in a case of the first type of dual die package in which two memory chips are stacked, a chip select pin (CSB0) for the top chip (TOP) and a chip select pin (CSB1) for the bottom chip (BOTTOM) are prepared in the package. The chip select pin (CSB0) is connected to the chip select pad of the top chip (TOP), and the chip select pin (CSB1) is connected to the chip select pad of the bottom chip (BOTTOM), respectively.

However, there may be a case where the positions of the chip select pins (CSB0) and (CSB1) in the dual die package are arranged differently from each other, or a case where a wiring routing from a pad of a semiconductor chip to a pin of a package can be difficult depending upon a mounted direction of a semiconductor chip. Accordingly, a method has been used for increasing the degree of freedom for package construction by providing two or more chip select pads or clock enable pads in one semiconductor chip. The two or more chip select pads or clock enable pads in one semiconductor chip perform a common function, and either two or more chip select pads or clock enable pads can be bonded to pins of the dual die package. However, in this case, the other pads that are not bonded to the pins of the package are in a not-connected state (NC), i.e., a floating state. When the other pads are continuously left in the floating state, a current due to an uncertain level of the other pads in the floating state may be induced to other circuits connected to the other pads. In order to prevent the induced current, the level of the pads that are not bonded needs to be internally fixed. However, it is difficult to recognize which pad is not bonded among two or more pads.

FIG. 2 is a block diagram illustrating an input stage of a conventional semiconductor device.

Referring to FIG. 2, an input stage of a conventional semiconductor device 200 includes at least two pads including a first pad 201 and a second pad 202, an electrical conductor 203 for electrically connecting the at least two pads, and an input buffer 204 for receiving an output signal outputted from the two pads 201, 202.

As illustrated in FIG. 2, the input stage of the semiconductor device 200 has a common electrical potential by connecting two or more pads to the electrical conductor.

For instance, when the first pad 201 is bonded to a chip select pin of an external package and the second pad 202 is in a floating state, the same input signal may be inputted to an internal circuit through the input buffer 204 because the first and second pads 201 and 202 have the same signal potential due to the electric conductor 203. Likewise, the operation is similar even in a case in which the second pad 202 is bonded to the chip select pin of the external package and the first pad 201 is in the floating state.

However, in the case of the input stage of the semiconductor device as illustrated in FIG. 2, there is a drawback in that the first and second pads 201 and 202 have increased input capacitances and increased clamp characteristics in comparison with the other pads since the two pads 201, 202 are connected through the electric conductor 203.

SUMMARY OF THE INVENTION

Accordingly, the present invention is provided to substantially obviate one or more problems due to limitations and disadvantages of the related art.

Example embodiments of the present invention provide an input stage of a semiconductor device that, where a pad of at least two pads performing a common function is bonded to an external pin, internal circuits are not affected by the other pads of the at least two pads.

Example embodiments of the present invention also provide a multi-chip package using a semiconductor chip that, where a pad of at least two pads performing a common function is bonded to an external pin, an internal circuit is not affected by the other pads of the at least two pads.

According to a first aspect of the invention, an input stage of a semiconductor device includes: at least two pads for performing a common function; input buffers respectively corresponding to the at least two pads; a current source for providing a current to the respective at least two pads in order that a predetermined fixed logic value is outputted by the input buffers while the respective at least two pads have a floating status; and a logic operation circuit for performing a logic operation on signals that are applied to the respective at least two pads via the input buffers, and configured to output a resultant value to an internal circuit.

A first pad of the at least two pads may be connected to a first pin of a plurality of pins of a semiconductor package on which the semiconductor device is mounted, while other pads of the at least two pads are in a non-connected state.

The current source may provide the current, a level of which is such that is capable of determining a logic value of the first pad based on a signal inputted to the first pin, and capable of determining a logic level of the other pads based on the current.

The logic operation circuit may perform the logic operation in which a signal inputted through the other non-connected pad is disregarded, and a signal inputted through the connected first pad may be outputted to an internal circuit.

The input stage of the semiconductor device may further include: a detection circuit for detecting a transition of a signal outputted from the respective input buffers to output a current cut-off signal; and a first switching circuit for preventing the current of the current source corresponding to the respective input buffers from being provided to a corresponding pad in response to the current cut-off signal.

The input stage of the semiconductor device may further include a latch circuit that stores the current cut-off signal.

The input stage of the semiconductor device may further include a delay circuit configured to delay the current cut-off signal by a predetermined delay time; and a second switching circuit for preventing the current cut-off signal from being input to the latch circuit in response to the delayed cut-off signal so as to prevent a signal stored in the latch circuit from being varied after the predetermined delay time.

The common function performed by the at least two pads may include a chip select function. The common function performed by the at least two pads may include a clock enable function.

According to another aspect, the present invention is directed to a multi-chip package which includes: semiconductor devices having a plurality of pads; and a plurality of pins to which the pads of the semiconductors are connected. At least one of the semiconductor devices includes an input stage, and the input stage includes: at least two pads for performing a common function; input buffers respectively corresponding to the at least two pads; a current source providing a current to the respective at least two pads in order that a predetermined fixed logic value is outputted by the input buffers while the respective at least two pads have a floating status; and a logic operation circuit for performing a logic operation on signals that are applied to the respective at least two pads via the input buffers, and for outputting a resultant value to an internal circuit. A first pad of the at least two pads is connected to a first pin of the plurality of pins, and other pads of the at least two pads are in a non-connected state.

The multi-chip package may be a dual die package having two semiconductor devices.

In one embodiment, the current source provides the current having a current level capable of determining a logic value of the connected first pad based on a signal inputted to the first pin, and capable of determining a logic level of the other non-connected pads based on the current.

In one embodiment, the logic operation circuit performs the logic operation in which a signal inputted through the other non-connected pad is disregarded, and a signal inputted through the connected first pad is outputted to an internal circuit.

The input stage of the semiconductor device may further includes: a detection circuit configured to detect a transition of a signal outputted from the respective input buffers to output a current cut-off signal; and a first switching circuit configured to prevent the current of the current source corresponding to the respective input buffers from being provided to a corresponding pad in response to the current cut-off signal. The input stage of the semiconductor device may further include: a latch circuit configured to store the current cut-off signal. The input stage of the semiconductor device may further include: a delay circuit configured to delay the current cut-off signal by a predetermined delay time; and a second switching circuit configured to prevent the current cut-off signal from being input to the latch circuit in response to the delayed cut-off signal so as to prevent a signal stored in the latch circuit from being varied after the predetermined delay time.

The common function performed by the at least two pads may include a chip select function. The common function performed by the at least two pads may include a clock enable function.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIGS. 5B and 5C are block diagrams illustrating an operation of the input stage of the semiconductor device of FIG. 5A.

DESCRIPTION OF THE EMBODIMENTS

Figure 1:
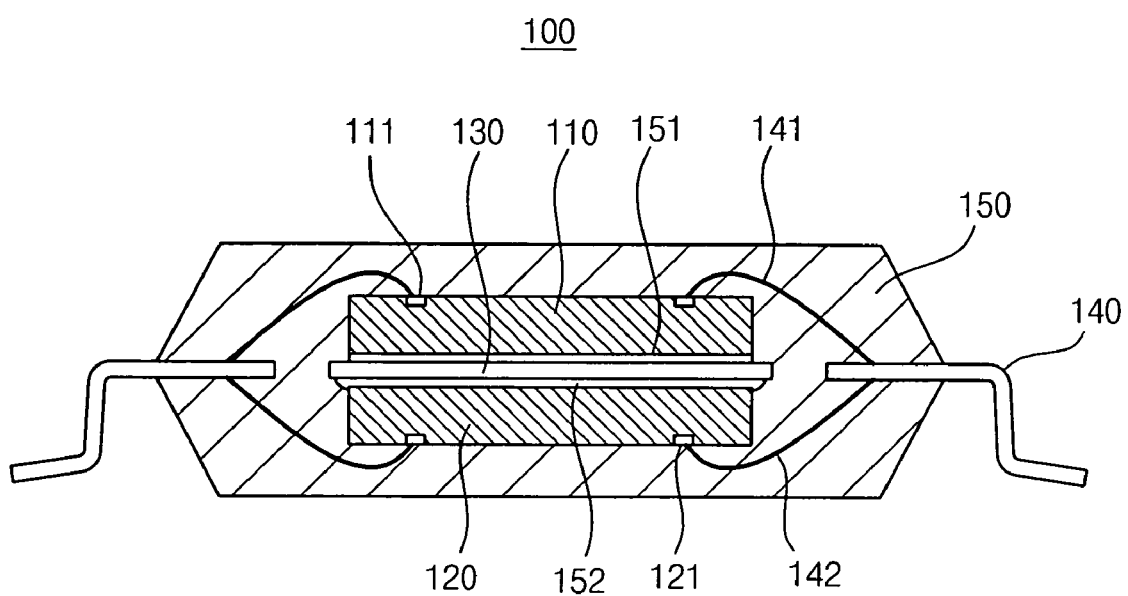
FIG. 1 is a cross-sectional view illustrating a conventional dual die package having a stacked structure.

Example embodiments of the present invention are described herein. However, specific structural and functional details described herein are merely representative for purposes of describing example embodiments of the present invention; however, example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

An input stage of a semiconductor device according to example embodiments of the present invention performs a logic operation on signals outputted from at least two pads. When a signal is inputted through one of the at least two pads, the input stage of the semiconductor device internally recognizes the inputted signal as one signal.

In order to perform the logic operation, an additional circuit may be used to fix a logic level of the inputted signal inputted through the respective at least two pads to a 'high' or 'low' level, by fixing respective levels of the at least two pads.

Figure 3:
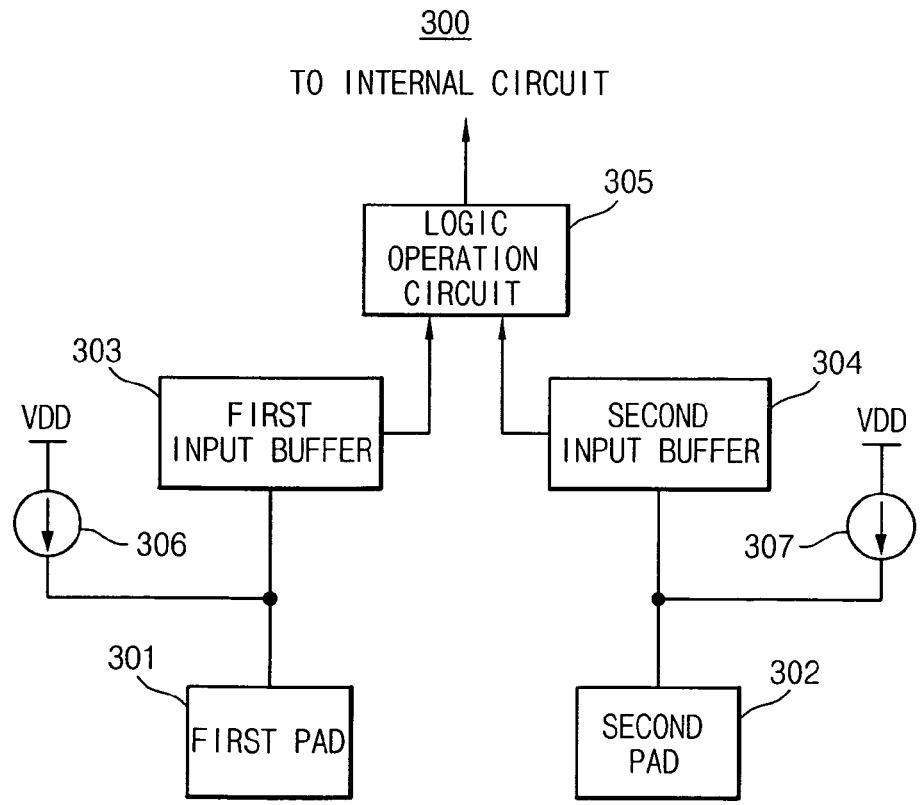
FIG. 3 is a block diagram illustrating an input stage of a semiconductor device according to an example embodiment of the present invention.

FIG. 3 is a block diagram illustrating an input stage of a semiconductor device according to an example embodiment of the present invention.

Referring to FIG. 3, an input stage of a semiconductor device 300 may include two or more pads including a first pad 301 and a second pad 302, a first input buffer 303 and a second input buffer 304 that respectively correspond to the first pad 301 and the second pad 302, and a logic operation circuit 305 configured to perform a logic operation on a signal inputted from an input buffer 303, 304.

The input stage of the semiconductor device 300 may further include current sources 306 and 307 that provide a small current to a corresponding pad 301, 302.

Figure 2:
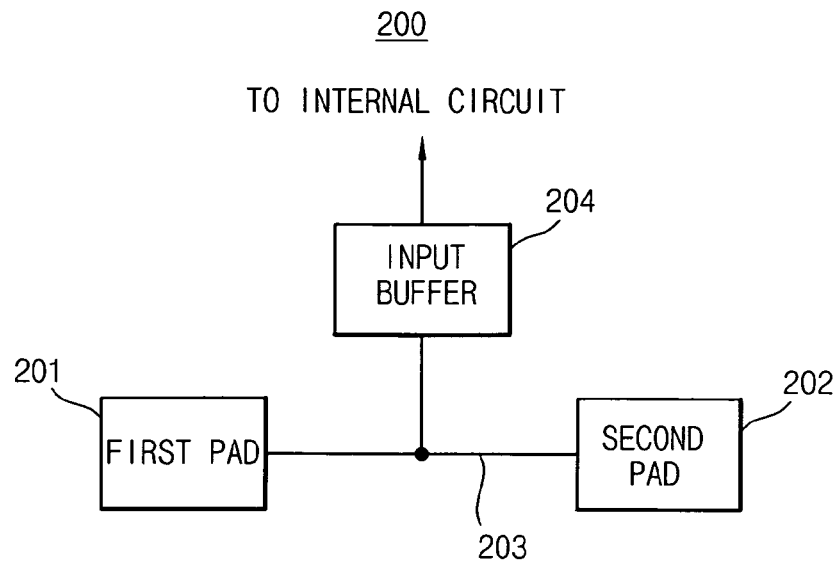
FIG. 2 is a block diagram illustrating an input stage of a conventional semiconductor device.

In comparison with the input stage of the conventional semiconductor device 200 for connecting two pads 201 and 202 using an electric conductor 203 illustrated in FIG. 2, the input stage of the semiconductor device 300 illustrated in FIG. 3 differs from the input stage of the conventional semiconductor device 200 of FIG. 2, in that the input stage of the semiconductor device 300 includes a logic operation circuit 305 for performing a logic operation on a signal inputted through two pads 301 and 302 and for outputting a resultant value. That is, the input stage of the semiconductor device 300 does not respond to an input signal of a pad that is not bonded to the pin of the semiconductor package, and performs the logic operation using the logic operation circuit 305, in order to transmit only an input signal of a pad bonded to a pin of a semiconductor package.

It is necessary to discriminate between a 'high' or a 'low' logic state of the signal in order to perform the logic operation on the signal. In this case, since the pad that is not bonded to the pin of the semiconductor package is in the floating state, it is impossible to discriminate between the 'high' or the 'low' state of the signal in the floating state; thus, the signal in the floating state should internally be set to the 'high' or 'low' state.

Accordingly, as shown in FIG. 3, the signal in the floating state may be fixed by the current sources 306 and 307 that supply a small current to the first and second pads 301 and 302. FIG. 3 shows the case in which the current sources 306 and 307 are connected to power supply voltage (VDD). Accordingly, the signal inputted through the first pad 301 or the second pad 302 may be fixed to a 'high' state. The current sources 306 and 307 may be implemented by a MOS transistor and/or a resistance element.

The current provided from the current sources has the minimum level that can be changed depending upon the signal outputted from the pin in the case of the pad bonded to the pin of the semiconductor package, and the current provided from the current sources has a fixed level in the case of the pad that is not bonded to the pin of the semiconductor package. That is, the level of the pad that is not bonded with the pin of the semiconductor package needs to be fixed by the minimum current of the current sources, and the level of the pad bonded with the pin of the semiconductor package needs to be decided depending upon the input signal, in the case that the input signal is inputted to a corresponding pad bonded with the pin of the semiconductor package. Alternatively, the level fixed by the current source may be decided depending upon the configuration of the logic operation circuit 305. FIG. 3 shows that the level of the first pad 301 and/or the second pad 302 is fixed to "high" level based the current sources 306 and 307 that are connected to the power supply voltage (VDD).

The input stage of the semiconductor device 300 shown in FIG. 3, in comparison with the input stage of the semiconductor device 200 shown in FIG. 2, has an advantage in that the pad bonded to the pin of the semiconductor package has the same input capacitance and clamp characteristics as those of the other pads that are not bonded to the pin of the semiconductor package. However, since a very small amount of current from the current source is continuously flowing through the pad bonded to the pin of the semiconductor package, a level of the pad bonded to the pin may be changed.

Accordingly, in order to prevent the level of the pad bonded to the pin from being variable due to the current source, the input stage of the semiconductor device 300 may additionally include a circuit that can internally detect the pad bonded to the pin of the semiconductor package to prevent the current provided from the current source from being provided to the pad bonded to the pin of the semiconductor package.

Figure 4A:
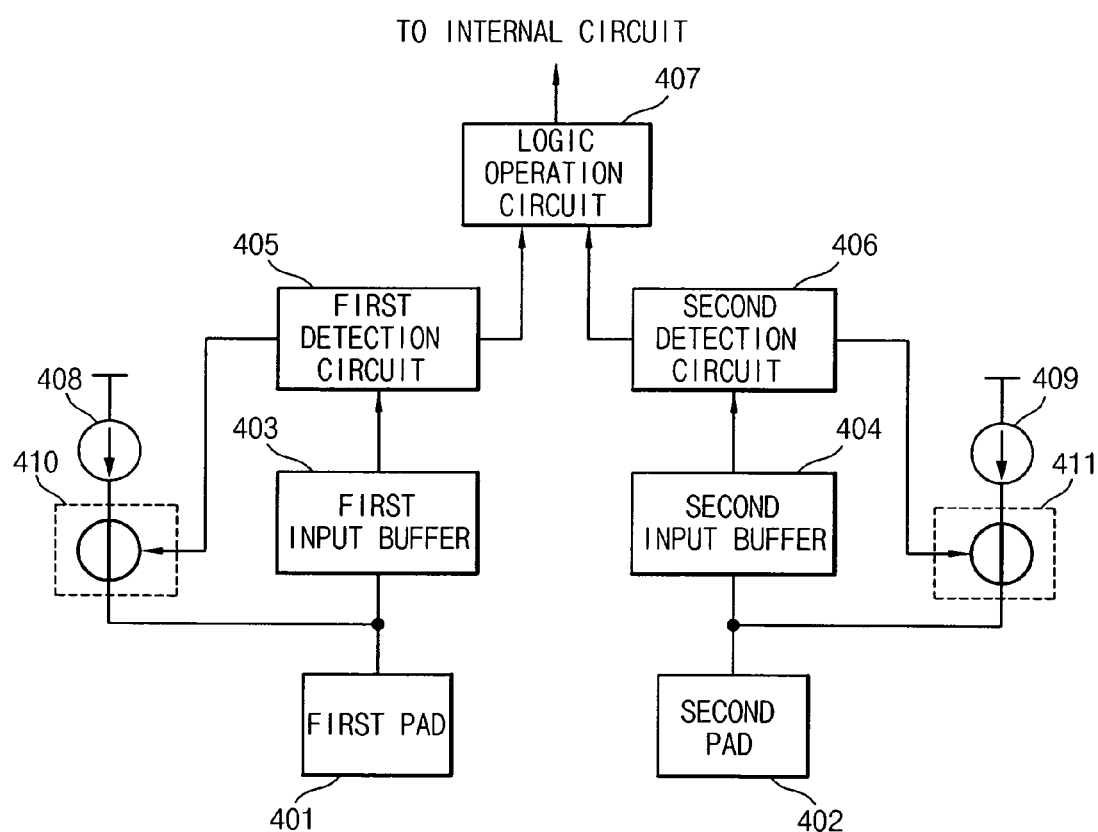
FIG. 4A is a block diagram illustrating an input stage of the semiconductor device, which is provided with a current cut-off function, according to another example embodiment of the present invention.
Figure 4B:
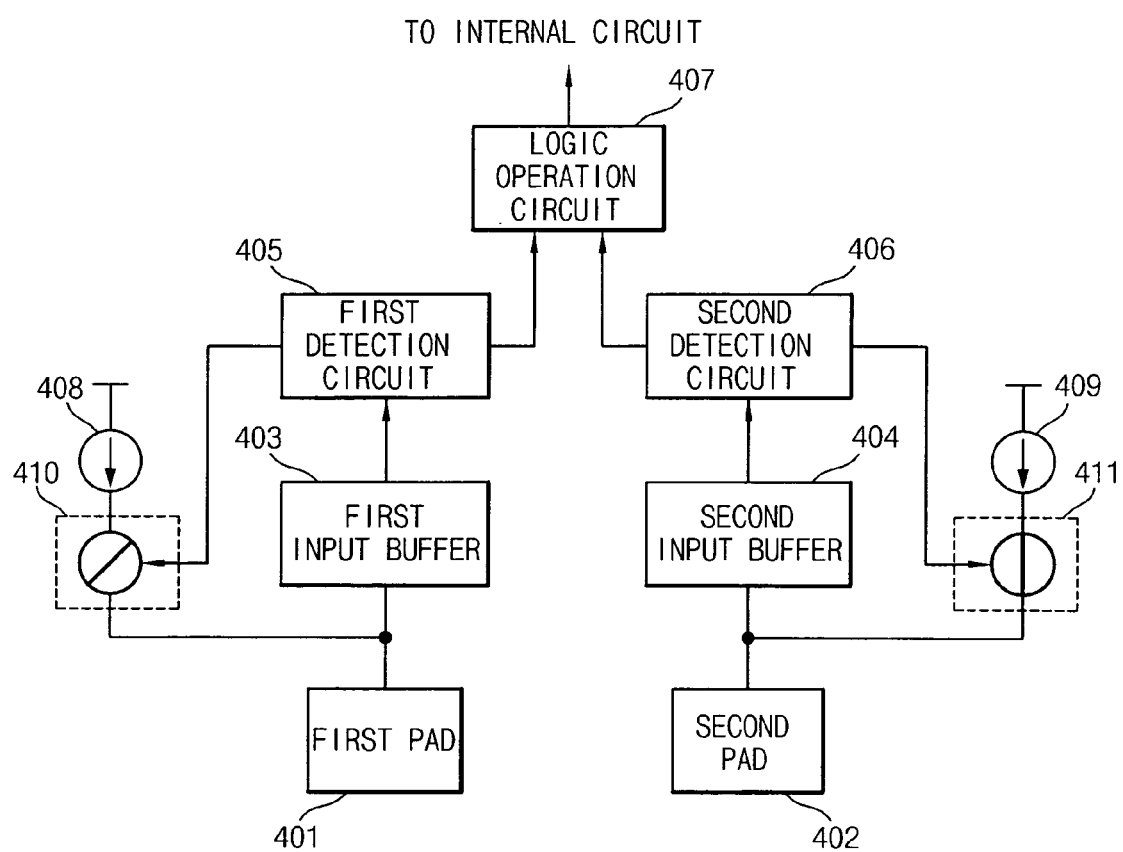
FIG. 4B is a block diagram illustrating an operation of the input stage of the semiconductor device of FIG. 4A.

FIG. 4A is a block diagram illustrating an input stage of a semiconductor device, which is provided with a current cut-off function, according to another example embodiment of the present invention, and FIG. 4B is a block diagram illustrating an operation of the input stage of the semiconductor device of FIG. 4A.

Referring to FIG. 4A, the semiconductor device input stage 400 includes two or more pads having a first pad 401 and a second pad 402, a first input buffer 403 and a second input buffer 404 that respectively correspond to the first and the second pads 401 and 402, and a logic operation circuit 407 that performs a logic operation on signals outputted from the respective input buffers. Like constituent elements of the semiconductor device input stage 400 are the same as those of the input stage of the semiconductor device 300 illustrated in FIG. 3.

The input stage of the semiconductor device 400 includes current sources 408 and 409 that respectively fix the level of the pads 401 and 402, in the same way as that of the input stage of the semiconductor device 300 illustrated in FIG. 3.

The input stage of the semiconductor device 400 further includes first and second detection circuits 405 and 406 configured to detect transition of a signal outputted from respective input buffers, and first and second switching circuits 410 and 411 configured to be controlled by the first and the second detection circuits 405 and 406, respectively.

The first detection circuit 405 detects a transition of the signal of the first pad 401 that is inputted to the first input buffer 403, and cuts off the current provided to the first pad 401 from the first current source 408 by outputting a current cut-off signal for controlling the first switching circuit 410 in case that a transition of the signal of the first pad 401 occurs. Similarly, the second detection circuit 406 detects a transition of the signal of the second pad 402 that is inputted to the second input buffer 404, and cuts off the current provided to the second pad from the second current source 409 by outputting the current cut-off signal for controlling the second switching circuit 411 in case that a transition of the signal of the second pad 402 occurs.

The first detection circuit 405 and the second detection circuit 406 determine whether or not corresponding pads are connected to the pin of the semiconductor package by detecting the transition of the signal that is inputted to the respective input buffers. That is, the signal of the pad that is not connected to the pin of the semiconductor package continues to maintain one of the 'high' level or 'low' level, which is internally determined by the current sources 408 and 409, after a predetermined time has passed, but the signal of the pad connected to the pin of the semiconductor package may be transitioned to the 'high' or 'low' state according to the input signal.

For instance, in case that the pad is connected to the chip select pin or the clock enable pin of the semiconductor package, the transition of the signal may occur continuously, but in case that the pad is not connected to the chip select pin or the clock enable pin of the semiconductor package, the signal of the pad has a fixed level based on the current source and the fixed level may be maintained.

Accordingly, the first detection circuit 405 and the second detection circuit 406 may include a transition detection circuit that detects a transition of the signal outputted from the input buffers. Alternatively, a first switching circuit 410 and a second switching circuit 411 that are controlled by the first detection circuit 405 and the second detection circuit 406, respectively, may be implemented by a MOS transistor, a transmission gate, etc.

Referring to FIG. 4B, an operation of a case in which the first pad 401 is bonded to the pin of the semiconductor package will be now described.

In an initial state, while both the first pad 401 and the second pad 402 maintain the 'high' state based on the current sources 408 and 409, the first pad 401 transitions to the 'low' state at a predetermined time period due to an inputted signal, because the first pad 401 is connected to the pin of the semiconductor package.

Here, the first detection circuit 405 detects the transition of the signal which is outputted from the first input buffer 403, outputs the current cut-off signal for controlling the first switching circuit 410 to cut off the connection between the current source 408 and the first pad 401. Accordingly, the first pad 401 that is disconnected from the current source 408 by the first switching circuit 410 may transmit a signal inputted from an external source directly to the input buffer 403 without disturbance from the current source 408.

The input stage of the semiconductor device may further include a latch circuit for maintaining a cut-off state by latching the current cut-off signal for cutting off the connection between the pad bonded to the pin of the semiconductor package and the current source.

Figure 5A:
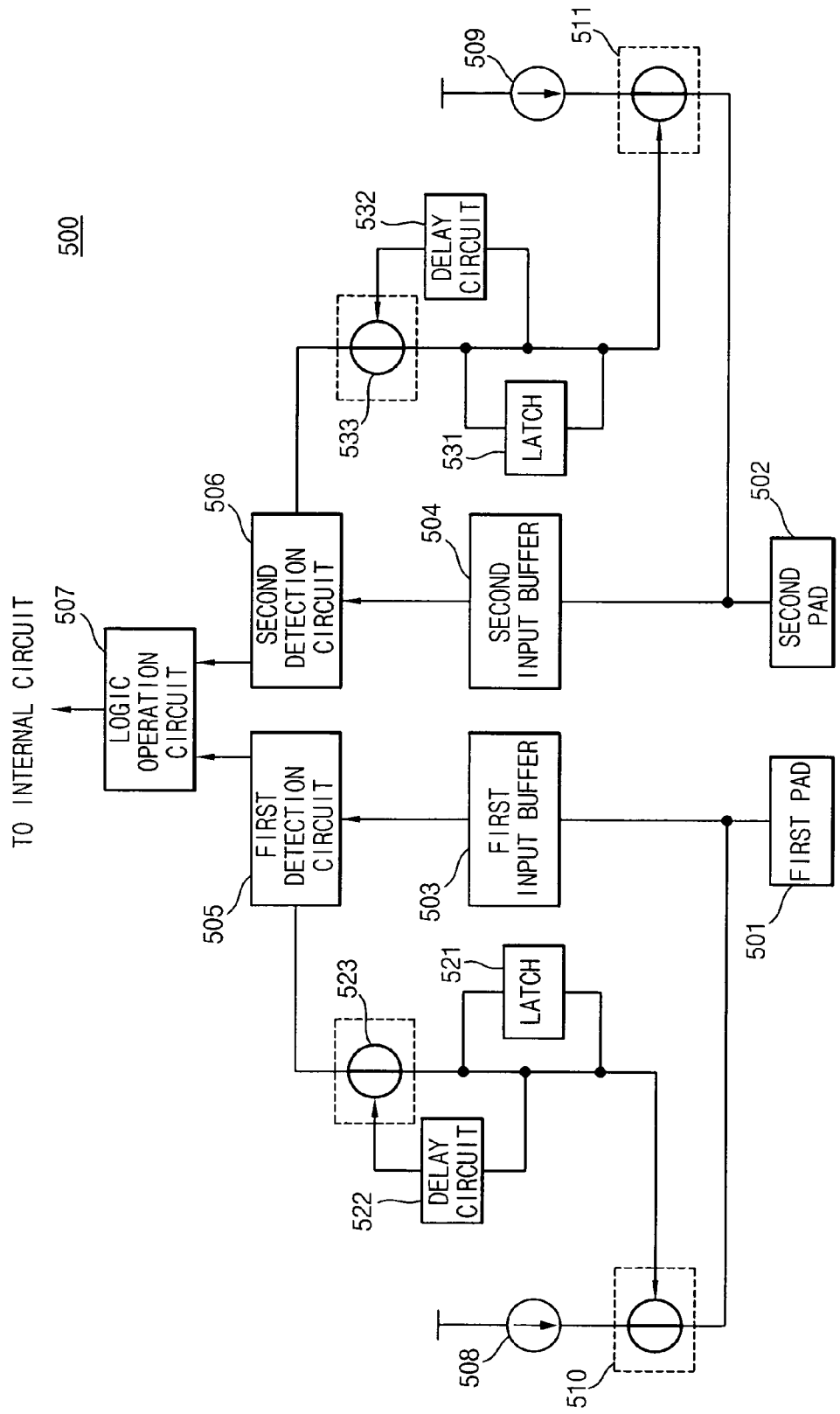
FIG. 5A is a block diagram illustrating an input stage of a semiconductor device, which is provided with a latch circuit, according to still another example embodiment of the present invention.
Figure 5B:
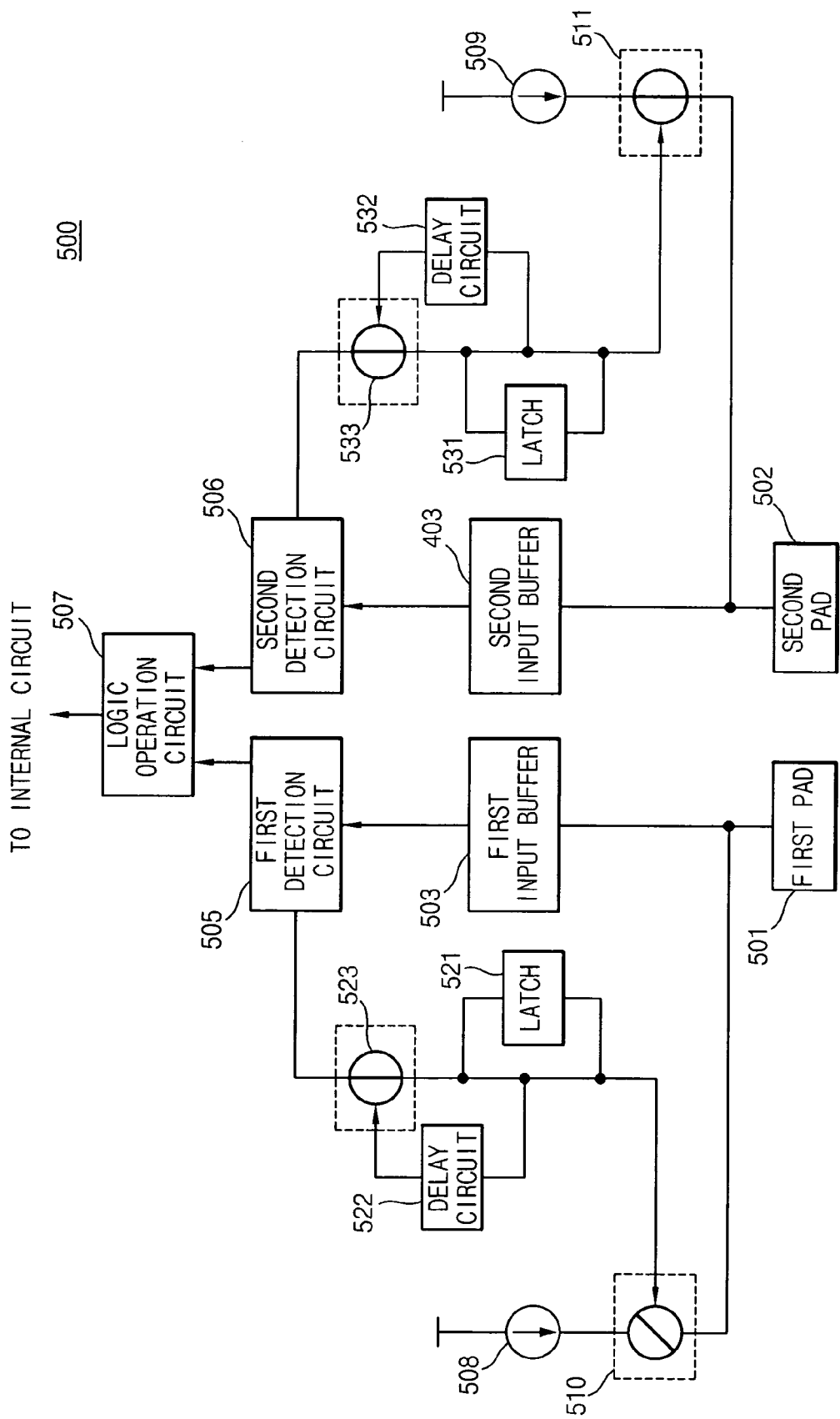

FIGS. 5A, 5B and 5C are block diagrams illustrating an input stage of a semiconductor device and an operation illustration of the input stage of the semiconductor device of FIG. 5A.

FIG. 5A is a block diagram illustrating the input stage of the semiconductor device, which is provided with a latch circuit, according to still another example embodiment of the present invention.

Referring to FIG. 5A, the input stage of the semiconductor device 500 includes two or more pads including a first pad 501 and a second pad 502, a first input buffer 503 and a second input buffer 504 that respectively correspond to the first pad and the second pad 501, 502, and a logic operation circuit 507 configured to perform a logic operation on a signal outputted from the respective input buffers. Like constituent elements of the semiconductor device input stage 500 are the same as those of the input stage of the semiconductor device 300 illustrated in FIG. 3 and the input stage of the semiconductor device 400 illustrated in FIG. 4A.

The input stage of the semiconductor device 500 further includes current sources 508 and 509, first and second detection circuits 505 and 506 and first and second switching circuits 510 and 511. The operations of the current sources 508 and 509, the first and the second detection circuits 505 and 506, and the first and the second switching circuits 510 and 511, are the same as those of the corresponding elements of the input stage 400 of the semiconductor device illustrated in FIG. 4A.

For instance, the first detection circuit 505 detects the transition of a first signal of the first pad 501 that is inputted to the first input buffer 503 to be outputted to the first detection circuit 505, and outputs the current cut-off signal for controlling the first switching circuit 510 to cut off the current that is provided to the first pad 501 from the first current source 508 in response to a transition of the first signal. Similarly, the second detection circuit 506 detects a transition of a second signal of the second pad 502 that is inputted to the second input buffer 504 to be outputted to the second detection circuit 506, and outputs the current cut-off signal for controlling the second switching circuit 511 to cut off the current provided to the second pad from the second current source 509 in response to the transition of the second signal.

The input stage of the semiconductor device includes latch circuits 521 and 531 configured to latch the current cut-off signals for controlling the first switching circuit 510 and the second switching circuit 511, which are outputted from the first detection circuit 505 and the second detection circuit 506.

Depending on an operation of the latch circuits 521 and 531, the first detection circuit 505 and the second detection circuit 506 detect the transitions of the first and second signals of the corresponding pads 501 and 502, and output the current cut-off signals. The current cut-off signals may be maintained by the latch circuits 521 and 531, and may continuously control the first switching circuit 510 and the second switching circuit 511.

The input stage 500 of the semiconductor device may also include delay circuits 522 and 532 that delay the current cut-off signals by a predetermined time delay respectively, and switching circuits 523 and 533 that are controlled by the delayed current cut-off signals.

For instance, when the latch circuit 521 latches the current cut-off signal outputted from the first detection circuit 505, the connection between the latch circuit 521 and the first detection circuit 505 is cut off by the switching circuit 523 according to the delayed current cut-off signal of the delay circuit 522 so that a value stored in the latch circuit 521 may be not changed by the current cut-off signal that is outputted from the first detection circuit 505 at a later time.

FIGS. 5B and 5C are block diagrams illustrating an operation of the input stage of the semiconductor device of FIG. 5A.

Referring to FIGS. 5B and 5C, for a case in which the first pad 501 is bonded to the pin of the semiconductor package and the second pad 502 is not bonded to the pin of the semiconductor package, the operation of the input stage 500 of the semiconductor device illustrated in FIG. 5A will be now described.

Referring to FIG. 5B, when the first detection circuit 505 detects a transition of the first signal of the first pad 501 that is inputted to the first input buffer 503 to be outputted to the first detection circuit 505, and the first detection circuit 505 outputs the current cut-off signal to the switching circuit 510, and the switching circuit 510 cuts off the connection between the current source 508 and the first pad 501.

In this case, the current cut-off signal that is outputted from the first detection circuit 505 is latched by the latch circuit 521. Accordingly, the switching circuit 510 maintains a cut-off state while the current cut-off signal latched by the latch circuit 521 has an active status.

Referring to FIG. 5C, the current cut-off signal outputted to the first detection circuit 505 is outputted to the switching circuit 523 via the delay circuit 522 with the predetermined time delay, and the switching circuit 523 cuts off the connection between the first detection circuit 505 and the latch circuit 521.

Accordingly, the value latched by the latch circuit 521 can be prevented from being changed again in response to the current cut-off signal that is outputted afterwards from the first detection circuit 505, and a stable operation can be maintained.

Figure 6:
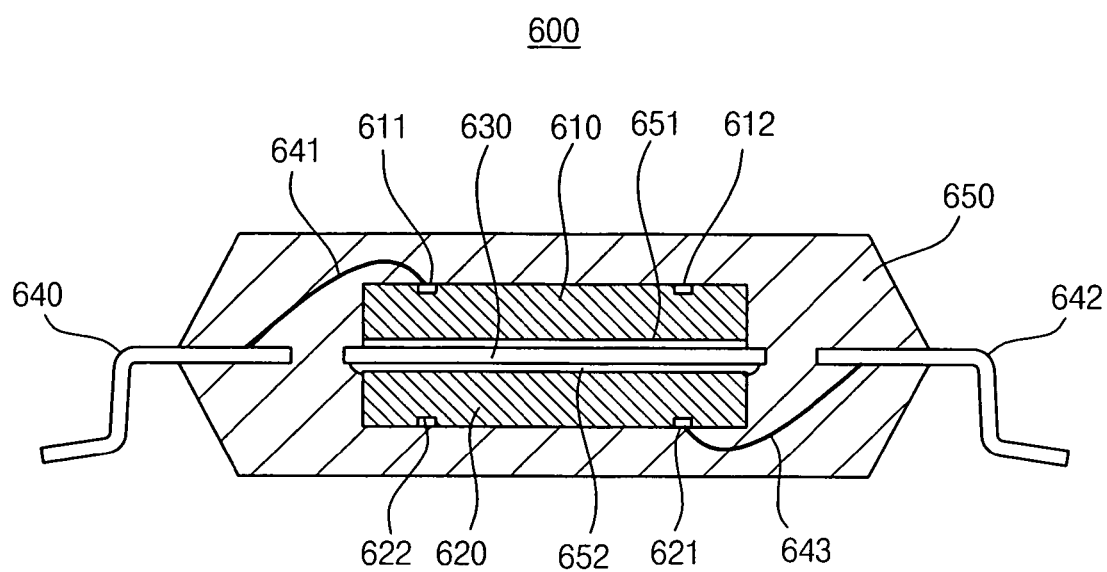
FIG. 6 is a cross-sectional view illustrating a multi-chip package using a semiconductor device having the input stage of the semiconductor device according to an example embodiment of the present invention.

FIG. 6 is a cross-sectional view illustrating a multi-chip package using a semiconductor device having the input stage of the semiconductor device according to an example embodiment of the present invention.

FIG. 6 specifically illustrates a dual die package 600 on which two semiconductor chips are mounted, in accordance with an embodiment of the invention. Referring to FIG. 6, a first semiconductor chip 610 and a second semiconductor chip 620 are attached on upper and lower surfaces of a die pad 630.

The first semiconductor chip 610 includes a first pad 611 and a second pad 612 for performing the common function. The second semiconductor chip 620 also includes a first pad 621 and a second pad 622 for performing the common function.

The first and the second semiconductor chips 610 and 620 include the input stage of the semiconductor device according to example embodiments of the present invention described herein, and the first pads 611 and 612 and the second pads 621 and 622 of the first and the second semiconductor chips 610 and 620 are included in the input stage of the semiconductor device according to example embodiments of the present invention described herein. In FIG. 6, these constituent elements are omitted and not shown.

Referring to FIG. 6, in a case of the first semiconductor chip 610, only the first pad 611 is wire-bonded to a lead 640 using a conductive metal wire 641, and the second pad 612 is in a floating state. Similarly, in a case of the second semiconductor chip 620, only the first pad 621 is wire-bonded to a lead 642 using a conductive metal wire 643, and the second pad 622 is in the floating state.

As shown in FIG. 6, only the first pads 611 and 621 of the first and the second semiconductor chips 610 and 620 are bonded to the pins of the package, and the second pads 612 and 622 are not bonded to the pins of the package. However, even though only one pad is bonded to an external pin, the internal circuit is not affected by the other pads by the operation of the input stage of the semiconductor device according to example embodiments of the present invention.

A package body 650 for protecting the constituent elements including the first and the second semiconductor chips 610 and 620 and bonding agents 651 and 652 for attaching the first and the second semiconductor chips 610 and 620 on upper and lower surfaces of the die pad 630, are the same as those of the conventional dual die package shown in FIG. 1, and thus a detailed description thereof will not be repeated.

As described above, according to the example embodiments of the present invention, the input stage of the semiconductor device performs the logic operation on the signal received from two or more pads performing the same function as each other. The multi-chip package includes the semiconductor chip that is provided with the input stage of the semiconductor device. Accordingly, even though only one pad is bonded to an external pin, the internal circuit may not be affected by the other pads that are not bonded to external pins.

While the example embodiments of the present invention and their advantages have been described in detail, it should be understood that various changes, substitutions and alterations may be made herein without departing from the scope of the invention.

What is claimed is:

1. An input stage of a semiconductor device comprising:
at least two pads configured to perform a common function, wherein a first pad of the at least two pads is connected to a first pin of a plurality of pins of a semiconductor package on which the semiconductor is mounted, and other pads of the at least two pads are in a non-connected state;
input buffers respectively corresponding to the at least two pads;
a current source configured to provide a current to the respective at least two pads in order that a predetermined fixed logic value is outputted by the input buffers while the respective at least two pads have a floating status; and a logic operation circuit configured to perform a logic operation on signals that are applied to the respective at least two pads via the input buffers, and configured to output a signal inputted through the connected first pad to an internal circuit.

2. The input stage of the semiconductor device of claim 1, wherein the current source provides the current having a current level capable of determining a logic value of the connected first pad based on a signal inputted to the first pin, and capable of determining a logic level of the other non-connected pads based on the current.

3. The input stage of the semiconductor device of claim 1, wherein the logic operation circuit performs the logic operation in which a signal inputted through the other non-connected pad is disregarded, and the signal inputted through the connected first pad is outputted to an internal circuit.

4. The input stage of the semiconductor device of claim 1, further comprising:
  a detection circuit configured to detect a transition of a signal outputted from the respective input buffers to output a current cut-off signal; and
  a first switching circuit configured to prevent the current of the current source corresponding to the respective input buffers from being provided to a corresponding pad in response to the current cut-off signal.

5. The input stage of the semiconductor device of claim 4, further comprising a latch circuit configured to store the current cut-off signal.

6. The input stage of the semiconductor device of claim 5, further comprising:
  a delay circuit configured to delay the current cut-off signal by a predetermined delay time; and
  a second switching circuit configured to prevent the current cut-off signal from being input to the latch circuit in response to the delayed cut-off signal so as to prevent a signal stored in the latch circuit from being varied after the predetermined delay time.

7. The input stage of the semiconductor device of claim 1, wherein the common function performed by the at least two pads includes a chip select function.

8. The input stage of the semiconductor device of claim 1, wherein the common function performed by the at least two pads includes a clock enable function.

9. A multi-chip package comprising:
  semiconductor devices having a plurality of pads; and
  a plurality of pins to which the pads of the semiconductor devices are connected, wherein at least one of the semiconductor devices includes an input stage, the input stage comprising:
  at least two pads configured to perform a common function, wherein a first pad of the at least two pads is connected to a first pin of the plurality of pins, and other pads of the at least two pads are in a non-connected state;
  input buffers respectively corresponding to the at least two pads;
  a current source configured to provide a current to the respective at least two pads in order that a predetermined fixed logic value is outputted by the input buffers while the respective at least two pads have a floating status; and
  a logic operation circuit configured to perform a logic operation on signals that are applied to the respective at least two pads via the input buffers, and configured to output a signal inputted through the connected first pad to an internal circuit.

10. The multi-chip package of claim 9, wherein the multi-chip package is a dual die package including the two semiconductor devices.

11. The multi-chip package of claim 9, wherein the current source provides the current having a current level capable of determining a logic value of the connected first pad based on a signal inputted to the first pin, and capable of determining a logic level of the other non-connected pads based on the current.

12. The multi-chip package of claim 9, wherein the logic operation circuit performs the logic operation in which a signal inputted through the other non-connected pad is disregarded, and the signal inputted through the connected first pad is outputted to an internal circuit.

13. The multi-chip package of claim 9, wherein the input stage of the semiconductor device further includes:
  a detection circuit configured to detect a transition of a signal outputted from the respective input buffers to output a current cut-off signal; and
  a first switching circuit configured to prevent the current of the current source corresponding to the respective input buffers from being provided to a corresponding pad in response to the current cut-off signal.

14. The multi-chip package of claim 13, wherein the input stage of the semiconductor device further includes a latch circuit configured to store the current cut-off signal.

15. The multi-chip package of claim 14, wherein the input stage of the semiconductor device further includes:
  a delay circuit configured to delay the current cut-off signal by a predetermined delay time; and
  a second switching circuit configured to prevent the current cut-off signal from being input to the latch circuit in response to the delayed cut-off signal so as to prevent a signal stored in the latch circuit from being varied after the predetermined delay time.

16. The multi-chip package of claim 9, wherein the common function performed by the at least two pads includes a chip select function.

17. The multi-chip package of claim 9, wherein the common function performed by the at least two pads includes a clock enable function.

18. An input stage of a semiconductor device comprising:
  at least two pads configured to perform a common function, wherein a first pad of the at least two pads is connected to a first pin of a plurality of pins of a semiconductor package on which the semiconductor device is mounted, and other pads of the at least two pads are in a non-connected state;
  input buffers respectively corresponding to the at least two pads;
  a current source configured to provide a current to the respective at least two pads in order that a predetermined fixed logic value is outputted by the input buffers while the respective at least two pads have a floating status; and
  a logic operation circuit configured to perform a logic operation on signals that are applied to the respective at least two pads via the input buffers, and configured to output a resultant value to an internal circuit, wherein the logic operation circuit performs the logic operation in which a signal inputted through the other non-connected pad is disregarded, and a signal inputted through the connected first pad is outputted to an internal circuit.

19. An input stage of a semiconductor device comprising:
  at least two pads configured to perform a common function;
  input buffers respectively corresponding to the at least two pads;

a current source configured to provide a current to the respective at least two pads in order that a predetermined fixed logic value is outputted by the input buffers while the respective at least two pads have a floating status;

a logic operation circuit configured to perform a logic operation on signals that are applied to the respective at least two pads via the input buffers, and configured to output a resultant value to an internal circuit;

a detection circuit configured to detect a transition of a signal outputted from the respective input buffers to output a current cut-off signal; and a first switching circuit configured to prevent the current of the current source corresponding to the respective input buffers from being provided to a corresponding pad in response to the current cut-off signal.

20. The input stage of the semiconductor device of claim 19, further comprising a latch circuit configured to store the current cut-off signal.

21. The input stage of the semiconductor device of claim 20, further comprising:

a delay circuit configured to delay the current cut-off signal by a predetermined delay time; and a second switching circuit configured to prevent the current cut-off signal from being input to the latch circuit in response to the delayed cut-off signal so as to prevent a signal stored in the latch circuit from being varied after the predetermined delay time.

22. An input stage of a semiconductor device comprising:

at least two pads configured to perform a common function, wherein the common function performed by the at least two pads includes a clock enable function;

input buffers respectively corresponding to the at least two pads;

a current source configured to provide a current to the respective at least two pads in order that a predetermined fixed logic value is outputted by the input buffers while the respective at least two pads have a floating status; and a logic operation circuit configured to perform a logic operation on signals that are applied to the respective at least two pads via the input buffers, and configured to output a resultant value to an internal circuit.

23. A multi-chip package comprising:

semiconductor devices having a plurality of pads; and a plurality of pins to which the pads of the semiconductor devices are connected, wherein at least one of the semiconductor devices includes an input stage, the input stage comprising:

at least two pads configured to perform a common function;

input buffers respectively corresponding to the at least two pads;

a current source configured to provide a current to the respective at least two pads in order that a predetermined fixed logic value is outputted by the input buffers while the respective at least two pads have a floating status; and a logic operation circuit configured to perform a logic operation on signals that are applied to the respective at least two pads via the input buffers, and configured to output a resultant value to an internal circuit, wherein a first pad of the at least two pads is connected to a first pin of the plurality of pins, and other pads of the at least two pads are in a non-connected state, wherein the logic operation circuit performs the logic operation in which a signal inputted through the other non-connected pad is disregarded, and a signal inputted through the connected first pad is outputted to an internal circuit.

24. A multi-chip package comprising:

semiconductor devices having a plurality of pads; and a plurality of pins to which the pads of the semiconductor devices are connected, wherein at least one of the semiconductor devices includes an input stage, the input stage comprising:

at least two pads configured to perform a common function;

input buffers respectively corresponding to the at least two pads;

a current source configured to provide a current to the respective at least two pads in order that a predetermined fixed logic value is outputted by the input buffers while the respective at least two pads have a floating status; and a logic operation circuit configured to perform a logic operation on signals that are applied to the respective at least two pads via the input buffers, and configured to output a resultant value to an internal circuit, wherein a first pad of the at least two pads is connected to a first pin of the plurality of pins, and other pads of the at least two pads are in a non-connected state, wherein the input stage of the semiconductor device further includes:

a detection circuit configured to detect a transition of a signal outputted from the respective input buffers to output a current cut-off signal; and a first switching circuit configured to prevent the current of the current source corresponding to the respective input buffers from being provided to a corresponding pad in response to the current cut-off signal.

25. The multi-chip package of claim 24, wherein the input stage of the semiconductor device further includes a latch circuit configured to store the current cut-off signal.

26. The multi-chip package of claim 25, wherein the input stage of the semiconductor device further includes:

a delay circuit configured to delay the current cut-off signal by a predetermined delay time; and a second switching circuit configured to prevent the current cut-off signal from being input to the latch circuit in response to the delayed cut-off signal so as to prevent a signal stored in the latch circuit from being varied after the predetermined delay time.

27. A multi-chip package comprising:

semiconductor devices having a plurality of pads; and a plurality of pins to which the pads of the semiconductor devices are connected, wherein at least one of the semiconductor devices includes an input stage, the input stage comprising:

at least two pads configured to perform a common function, wherein the common function performed by the at least two pads includes a clock enable function;

input buffers respectively corresponding to the at least two pads;

a current source configured to provide a current to the respective at least two pads in order that a predetermined fixed logic value is outputted by the input buffers while the respective at least two pads have a floating status; and a logic operation circuit configured to perform a logic operation on signals that are applied to the respective at least two pads via the input buffers, and configured to output a resultant value to an internal circuit, and wherein a first pad of the at least two pads is connected to a first pin of the plurality of pins, and other pads of the at least two pads are in a non-connected state.

* * * * *